(12) United States Patent
Ballard

(10) Patent No.: US 7,856,158 B2
(45) Date of Patent: Dec. 21, 2010

(54) VIRTUAL ELECTRONIC SWITCH SYSTEM

(76) Inventor: Claudio R. Ballard, 26 S. Compass Blvd., Ft. Lauderdale, FL (US) 33308

( * ) Notice: Subject to any disclaimer, the term of this patent is extended or adjusted under 35 U.S.C. 154(b) by 60 days.

(21) Appl. No.: 12/398,901

(22) Filed: Mar. 5, 2009

(65) Prior Publication Data

US 2009/0274416 A1 Nov. 5, 2009

Related U.S. Application Data

(60) Provisional application No. 61/034,896, filed on Mar. 7, 2008.

(51) Int. Cl.
*G02B 6/00* (2006.01)
*G02B 6/42* (2006.01)
*G06F 19/00* (2006.01)
*G01M 17/00* (2006.01)
*G09G 5/00* (2006.01)

(52) U.S. Cl. .................. 385/19; 385/147; 701/33; 701/213; 362/494; 345/61

(58) Field of Classification Search ............. 385/19–25, 385/135–139, 147; 345/61, 156, 184; 362/494, 362/140, 141; 307/64, 66; 701/3, 29, 33, 701/35, 213

See application file for complete search history.

(56) References Cited

U.S. PATENT DOCUMENTS

| | | | |
|---|---|---|---|
| 1,848,064 A | 3/1932 | Oishei |
| 2,180,731 A | 11/1939 | Dickinson |
| 2,496,700 A | 2/1950 | Cole |
| 2,786,359 A | 3/1957 | Karlan et al. |
| 2,801,118 A | 7/1957 | Amesbury |
| 2,881,860 A | 4/1959 | Ternes |
| 2,897,916 A | 8/1959 | Probst |
| 3,133,741 A | 5/1964 | Garabello |
| 3,259,684 A | 7/1966 | Wakefield |
| 3,279,834 A | 10/1966 | Budzynski |
| 3,351,364 A | 11/1967 | Warn et al. |
| 3,433,891 A | 3/1969 | Mackenzie, Jr. et al. |
| 3,435,701 A | 4/1969 | Bucher |

(Continued)

FOREIGN PATENT DOCUMENTS

DE 19526809 A1 1/1997

(Continued)

OTHER PUBLICATIONS

Ethernet over twisted pair; Wikipedia, the free encyclopedia; Jun. 3, 2008; pp. 1-3; available at http://en.wikipedia.org/wiki/Ethernet_over_twisted_pair.

(Continued)

*Primary Examiner*—Akm E Ullah
(74) *Attorney, Agent, or Firm*—Howison & Arnott, L.L.P.

(57) ABSTRACT

A virtual electronic switch system for a vehicle is provided. In one example, the system includes a switch assembly, a switch interface, and a computer. The switch assembly provides actuators that interface with non-contact sensors in the switch interface. The computer is coupled to the switch interface and assigns functions to each of the actuators. The non-contact sensors detect movement of the actuators and signal the computer, which manipulates an electrical system in the vehicle based on the assigned function.

19 Claims, 10 Drawing Sheets

U.S. PATENT DOCUMENTS

| | | |
|---|---|---|
| 3,641,746 A | 2/1972 | Smith et al. |
| 3,691,525 A | 9/1972 | McClellan et al. |
| 3,831,209 A | 8/1974 | Clingman |
| 4,061,054 A | 12/1977 | Wenninger |
| 4,135,593 A | 1/1979 | Fowkes |
| 4,236,274 A | 12/1980 | Omote et al. |
| 4,441,382 A | 4/1984 | Snooks |
| 4,515,393 A | 5/1985 | Sauter |
| 4,590,339 A | 5/1986 | Scott-Jackson et al. |
| 4,591,211 A | 5/1986 | Browning et al. |
| 4,707,788 A | 11/1987 | Tashiro et al. |
| 4,771,368 A | 9/1988 | Tsukamoto et al. |
| 4,772,299 A | 9/1988 | Bogusz |
| 4,807,490 A | 2/1989 | Foggini |
| 4,825,669 A | 5/1989 | Herrera |
| 5,048,471 A | 9/1991 | Takli et al. |
| 5,064,274 A | 11/1991 | Alten |
| 5,066,062 A | 11/1991 | Sekulovski |
| 5,121,818 A | 6/1992 | McComic |
| 5,133,750 A | 7/1992 | Momose et al. |
| 5,149,915 A | 9/1992 | Brunker et al. |
| 5,156,198 A | 10/1992 | Hall |
| 5,304,739 A | 4/1994 | Klug et al. |
| 5,322,340 A | 6/1994 | Sato et al. |
| 5,431,485 A | 7/1995 | Hayashi |
| 5,517,173 A | 5/1996 | Cha et al. |
| 5,557,698 A | 9/1996 | Gareis et al. |
| 5,613,012 A | 3/1997 | Hoffman et al. |
| 5,615,277 A | 3/1997 | Hoffman |
| 5,635,903 A | 6/1997 | Koike et al. |
| 5,637,933 A | 6/1997 | Rawlings et al. |
| 5,738,369 A | 4/1998 | Durrani |
| 5,745,027 A | 4/1998 | Malville |
| 5,770,797 A | 6/1998 | Lapohn |
| 5,794,733 A | 8/1998 | Stosel et al. |
| 5,802,922 A | 9/1998 | Kawai et al. |
| 5,808,374 A | 9/1998 | Miller et al. |
| 5,853,857 A | 12/1998 | Mahmood et al. |
| 5,870,723 A | 2/1999 | Pare, Jr. et al. |
| 5,910,988 A | 6/1999 | Ballard |
| 5,934,744 A | 8/1999 | Jergens et al. |
| D416,525 S | 11/1999 | Sacco et al. |
| 5,988,238 A | 11/1999 | Palvolgyi |
| 6,032,137 A | 2/2000 | Ballard |
| 6,092,898 A | 7/2000 | De Juan, Jr. |
| 6,116,700 A | 9/2000 | Herrera |
| 6,182,807 B1 | 2/2001 | Saito et al. |
| 6,198,244 B1 | 3/2001 | Hayden et al. |
| D440,918 S | 4/2001 | Pfeiffer |
| 6,234,555 B1 | 5/2001 | Emmerich et al. |
| 6,253,131 B1 | 6/2001 | Quigley et al. |
| 6,253,716 B1 | 7/2001 | Palmer et al. |
| 6,263,447 B1 | 7/2001 | French et al. |
| 6,269,348 B1 | 7/2001 | Pare, Jr. et al. |
| 6,282,658 B2 | 8/2001 | French et al. |
| 6,321,339 B1 | 11/2001 | French et al. |
| 6,357,563 B1 | 3/2002 | Hayford et al. |
| 6,366,682 B1 | 4/2002 | Hoffman et al. |
| 6,397,198 B1 | 5/2002 | Hoffman et al. |
| 6,411,728 B1 | 6/2002 | Lee et al. |
| 6,479,973 B2 | 11/2002 | Saito et al. |
| D741,139 | 3/2003 | Wyszogrod et al. |
| D481,337 S | 10/2003 | Hartono et al. |
| 6,693,523 B1 | 2/2004 | Abel et al. |
| 6,718,842 B1 | 4/2004 | Bofias |
| D492,629 S | 7/2004 | Hartono et al. |
| 6,780,047 B1 | 8/2004 | Laity |
| 6,843,115 B2 | 1/2005 | Rutherford |
| 6,882,917 B2 * | 4/2005 | Pillar et al. .................. 701/48 |
| 7,004,787 B2 | 2/2006 | Milan |
| 7,055,883 B2 | 6/2006 | Tokutomi et al. |
| 7,068,158 B2 | 6/2006 | Komatsu et al. |
| 7,146,129 B2 | 12/2006 | Bostrom et al. |
| 7,165,871 B2 | 1/2007 | Takeda et al. |
| D537,393 S | 2/2007 | Chanteloup |
| 7,206,672 B2 | 4/2007 | Mueller |
| 7,257,397 B2 | 8/2007 | Shamoon et al. |
| D551,604 S | 9/2007 | Kapffenstein |
| 7,266,435 B2 | 9/2007 | Wang et al. |
| D551,971 S | 10/2007 | Hardwick |
| D559,159 S | 1/2008 | Kazyaka |
| D562,738 S | 2/2008 | Young |
| 7,375,285 B2 | 5/2008 | Chiang |
| D571,268 S | 6/2008 | Hoffman |
| 7,392,122 B2 * | 6/2008 | Pillar et al. .................. 701/48 |
| D574,661 S | 8/2008 | Logan |
| D575,581 S | 8/2008 | Harris |
| D581,843 S | 12/2008 | Kluck |
| 7,483,952 B2 | 1/2009 | Light et al. |
| 2002/0073507 A1 | 6/2002 | Presley |
| 2002/0082750 A1 | 6/2002 | Lamke et al. |
| 2003/0011546 A1 | 1/2003 | Obata et al. |
| 2003/0225693 A1 | 12/2003 | Ballard et al. |
| 2004/0002794 A1 * | 1/2004 | Pillar et al. .................. 701/1 |
| 2004/0043753 A1 | 3/2004 | Wake et al. |
| 2004/0129197 A1 | 7/2004 | Nakagawa et al. |
| 2004/0155789 A1 | 8/2004 | Crews |
| 2004/0158723 A1 | 8/2004 | Root |
| 2005/0021190 A1 | 1/2005 | Worrell et al. |
| 2005/0140129 A1 | 6/2005 | Miki et al. |
| 2005/0141225 A1 | 6/2005 | Striebel |
| 2005/0168071 A1 | 8/2005 | Durbin et al. |
| 2005/0234622 A1 * | 10/2005 | Pillar et al. .................. 701/41 |
| 2005/0257613 A1 | 11/2005 | Spencer et al. |
| 2005/0264268 A1 | 12/2005 | Ueno |
| 2006/0053281 A1 | 3/2006 | Andersson |
| 2006/0097577 A1 | 5/2006 | Kato et al. |
| 2006/0097852 A1 | 5/2006 | Lammers et al. |
| 2006/0162485 A1 | 7/2006 | Leng et al. |
| 2006/0266273 A1 | 11/2006 | Westberg et al. |
| 2007/0001830 A1 | 1/2007 | Dagci et al. |
| 2007/0024117 A1 | 2/2007 | Boenker, IV et al. |
| 2007/0030137 A1 | 2/2007 | Masters et al. |
| 2007/0077058 A1 | 4/2007 | Kontani |
| 2007/0137367 A1 | 6/2007 | Papa et al. |
| 2008/0002420 A1 | 1/2008 | Lambert et al. |
| 2008/0007961 A1 | 1/2008 | Mochizuki et al. |
| 2008/0031004 A1 | 2/2008 | Chu |
| 2008/0034209 A1 | 2/2008 | Dickinson et al. |
| 2008/0157593 A1 | 7/2008 | Bax et al. |
| 2008/0222844 A1 | 9/2008 | Broadhead et al. |
| 2009/0011639 A1 | 1/2009 | Ballard et al. |
| 2009/0016216 A1 | 1/2009 | Ballard et al. |
| 2009/0223318 A1 | 9/2009 | Ballard |
| 2009/0223437 A1 | 9/2009 | Ballard |
| 2009/0223438 A1 | 9/2009 | Ballard |
| 2009/0223757 A1 | 9/2009 | Ballard |
| 2009/0223789 A1 | 9/2009 | Ballard |
| 2009/0224895 A1 | 9/2009 | Ballard |
| 2009/0267405 A1 | 10/2009 | Ballard |
| 2009/0271949 A1 | 11/2009 | Sprague et al. |
| 2009/0272313 A1 | 11/2009 | Ballard et al. |
| 2009/0272589 A1 | 11/2009 | Ballard |
| 2009/0273170 A1 | 11/2009 | Ballard et al. |
| 2009/0273208 A1 | 11/2009 | Ballard et al. |
| 2009/0273282 A1 | 11/2009 | Ballard et al. |
| 2009/0273942 A1 | 11/2009 | Ballard et al. |
| 2009/0274416 A1 | 11/2009 | Ballard |
| 2009/0277707 A1 | 11/2009 | Ballard |
| 2009/0289062 A1 | 11/2009 | Ballard |

2009/0289757 A1  11/2009  Ballard

FOREIGN PATENT DOCUMENTS

| DE | 10311396 A1 | 9/2004 |
|---|---|---|
| DE | 102004053238 A1 | 5/2006 |
| EP | 0507225 A | 10/1992 |
| EP | 1429348 A | 6/2004 |
| EP | 1493630 | 1/2005 |
| GB | 462033 A | 3/1937 |
| GB | 2203483 A | 10/1988 |
| JP | 5-169981 A | 7/1993 |

OTHER PUBLICATIONS

PCT: International Search Report and Written Opinion of PCT/US2009/059073 (related application); Jan. 22, 2010; 7 pgs.
PCT: International Search Report and Written Opinion of PCT/US2009/045063 (related application); Aug. 12, 2009; 7 pgs.
PCT: International Search Report and Written Opinion of PCT/US2009/043649 (related application); Aug. 10, 2009; 8 pgs.
PCT: International Search Report and Written Opinion of PCT/US2009/036322 (related application); Jun. 11, 2009; 8 pgs.
PCT: International Search Report and Written Opinion of PCT/US2009/036234 (related application); Dec. 21, 2009; 6 pgs.
PCT: International Search Report and Written Opinion of PCT/US2009/036190 (related application); Jul. 15, 2009; 8 pgs.
PCT: International Search Report and Written Opinion of PCT/US2009/036078 (related application); Apr. 15, 2009; 7 pgs.
PCT: International Search Report and Written Opinion of PCT/US2009/036073 (related application); May 16, 2009; 8 pgs.
PCT: International Search Report and Written Opinion of PCT/US2009/036001 (related application); Apr. 14, 2009; 12 pgs.
PCT: International Search Report and Written Opinion of PCT/US2009/035850 (related application); Apr. 15, 2009; 9 pgs.
PCT: International Search Report and Written Opinion of PCT/US2009/035844 (related application); Apr. 23, 2009; 7 pgs.
PCT: International Search Report and Written Opinion of PCT/US2009/035715 (related application); Apr. 29, 2009; 8 pgs.
PCT: International Search Report and Written Opinion of PCT/US2009/035626 (related application); Jun. 3, 2009; 7 pgs.
PCT: International Search Report and Written Opinion of PCT/US2009/035625 (related application); May 25, 2009; 9 pgs.
PCT: International Search Report and Written Opinion of PCT/US2009/035615 (related application); Jul. 14, 2009; 7 pgs.
PCT: International Search Report and Written Opinion of PCT/US2009/035614 (related application); Aug. 21, 2009; 10 pgs.
PCT: International Preliminary Report on Patentability of PCT/IB2008/002056 (related application); Dec. 7, 2009.
PCT: International Preliminary Report on Patentability of PCT/IB2008/002060 (related application); Dec. 7, 2009.
PCT: International Search Report and Written Opinion of PCT/IB2008/002056 (related application); Jan. 7, 2009; 9 pgs.
PCT: International Search Report and Written Opinion of PCT/IB2008/002060 (related application); Feb. 16, 2009; 12 pgs.
Vanderwerp, Dave, "2011 Dodge Circuit EV—First Drive Review." Jun. 2009; pp. 1-4; available at http://www.caranddriver.com/reviews/car/09q2/2011_dodge_circuit_ev-first_drive_review.

* cited by examiner

VIRTUAL ELECTRONIC SWITCH SYSTEM

CROSS-REFERENCE TO RELATED APPLICATIONS

This application claims the benefit of U.S. Provisional Application for Patent Ser. No. 61/034,896, filed Mar. 7, 2008, and entitled VIRTUAL ELECTRONIC SWITCH MECHANISM, the specification of which is incorporated herein in its entirety by reference.

TECHNICAL FIELD

The invention relates to a switch assembly having actuators that may be assigned various functions.

BACKGROUND

Conventional switches for automotive applications are typically designed for each application. Such switches often include a molded plastic body with a biased or spring loaded switch having metallic contacts, and are generally designed for controlling a particular application or function. After the design of the switch, a large investment may be made to produce the tooling to make the switches. For example, it may cost tens or hundreds of thousands of dollars to prepare molds to make the plastic components of the switches. Similarly, the design of the contacts employed in such switches, the springs, and other parts of the switch may require tooling to produce components unique to the particular switch. Thus, there exists a need for a switch and switch assembly configuration that does not require retooling and redesign for each application or function controlled or for use in different vehicle styles.

SUMMARY

In one embodiment, the present disclosure provides a non-contact vehicle switch system comprising a switch assembly, a switch interface, and a computer. The switch assembly includes a front end and a back end. The front end includes a plate mountable in the vehicle and customizable first and second user accessible features mounted thereon. The back end includes first and second actuator members coupled to the first and second user accessible features, respectively, wherein the first and second actuator members provide a switch assembly interface. The switch interface is coupled to the vehicle and configured to engage the switch assembly interface. The switch interface includes first and second non-contact sensor units configured to detect a pre-defined movement pattern of the first and second actuator members, respectively. The computer is coupled to the switch interface. The computer is configured to receive information from the first and second non-contact sensor units, and to manipulate at least one function of an electrical system using the received information. The manipulated function is selected from a plurality of available functions and assigned to one of the first and second sensor units based on instructions provided to the computer.

In another embodiment, the present disclosure provides a virtual electronic switch system comprising a switch assembly, a switch interface, and a computer. The switch assembly has a plurality of actuators coupled to a support structure, wherein each of the plurality of actuators includes a user manipulatable portion accessible from an external faceplate and an actuator portion that extends through the external faceplate. The switch interface has a plurality of non-contact sensors configured to mate with the actuator portions of the plurality of actuators, wherein each of the plurality of non-contact sensors is configured to detect movement within a defined movement range for each of the corresponding actuator portions. The computer is coupled to the switch interface and configured to receive information about the switch assembly. The information includes a position and a function assigned to each of the plurality of actuators and associated non-contact sensors. The function assigned to a particular one of the plurality of actuators and non-contact switches is selected from a plurality of available functions. The computer is configured to receive a signal from one of the plurality of non-contact sensors indicating a detected movement of the corresponding actuator portion and to execute the function included in the information in response to the received signal.

In yet another embodiment, a vehicle switch assembly comprises a plurality of manually operated switching actuators, a plurality of electronic non-contact sensing devices, a microprocessor, and a memory. The plurality of manually operated switching actuators are mounted in a vehicle at a location accessible to an operator driving the vehicle. Each of the manually operated switching actuators is associated with an electrically powered device mounted on the vehicle. At least one of the electronic non-contact sensing devices is associated with at least one of the plurality of manually operated switching actuators and mounted in proximity to the manually operated switching actuators such that the non-contact sensing device can sense movement of the manually operated switching actuators. The microprocessor is operatively connected to at least one of the plurality of electronic non-contact sensing devices. The memory is associated with the microprocessor and includes program logic for controlling the electrically powered device. At least one of the electronic non-contact sensing devices senses movement of one of the manually operated switching actuators and transmits a first signal to the microprocessor, wherein the microprocessor is configured to access the memory to retrieve program logic for controlling the electrically powered device and to send a second signal to energize or de-energize the electrically powered device based on the first signal.

BRIEF DESCRIPTION OF THE DRAWINGS

For a more complete understanding, reference is now made to the following description taken in conjunction with the accompanying Drawings in which.

DETAILED DESCRIPTION

Figure 1:
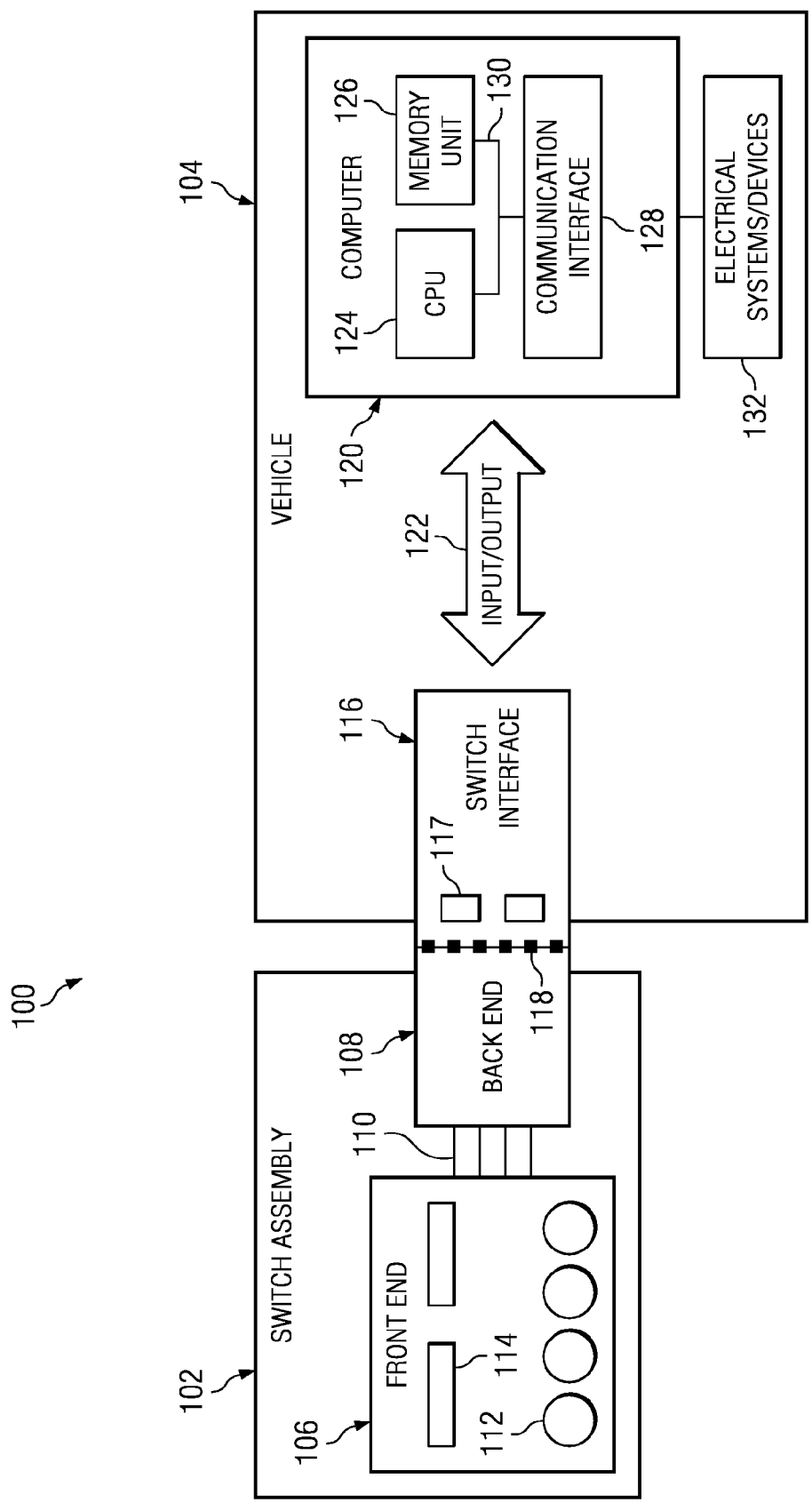
FIG. 1 is a diagram of one embodiment of a virtual electronic switch system.

Referring now to the drawings, wherein like reference numbers are used herein to designate like elements throughout, the various views and embodiments of a virtual electronic switch mechanism. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring to FIG. 1, one embodiment of a virtual electronic switch system 100 is illustrated with a switch assembly 102 and a vehicle 104. The switch assembly 102 has a front end 106 and a back end 108. Although shown as coupled by lines 110, it is understood that the lines 110 merely serve to graphically illustrate that the front end 106 and back end 108 are connected and do not denote a particular type of connection. For example, a switch accessible on the front end 106 may extend through the back end 108, thereby forming a connection. The front end 102 has a plurality of actuators 112 and may also include indicators 114. The switch assembly 102 may have many different configurations, and the presence and number of various components may vary. For example, the presence, number, and position of actuators 112 may vary, as may the type of actuator (e.g., buttons, switches, and/or rotary dials). Similarly, the presence, number, and position of indicators 114 may vary, as may the type of indicators (e.g., visual and/or audible).

When installed in the vehicle 104, the back end 108 of the switch assembly 102 is coupled to a switch interface 116 in the vehicle. As will be described below in greater detail, the switch interface 116 provides a contact free interface for the actuators 112. Although not described in detail herein, the indicators 114 may be coupled to the switch interface 116 or to another interface (not shown). The contact free interface provided by the switch interface 116 enables the actuators 112 of the front end 106 of the switch assembly 102 to be configured as desired. The connections on the back end 108 are configured to match the connections in the switch interface 116, as illustrated by dotted line 118. Accordingly, when the switch assembly 102 is installed in the vehicle 104, the back end 108 aligns with the switch interface 116 and the switch interface 116 is able to communicate with the switch assembly 102.

In the present example, the switch interface 116 includes non-contact sensors 117 that provide detection functionality to detect actuation of the actuators 112, regardless of how the detected actuation is used by the vehicle 104. However, the switch interface 116 is physically configured to interact with the back end 108 in a particular manner, and if certain aspects of the physical configuration of the back end are changed (e.g., the physical location of a switch or altering the behavior of a particular actuator (e.g., replacing a switch with a push button)), then the switch interface 116 may need to be changed in a corresponding manner.

The switch interface 116 is coupled to a computer 120 for data input/output 122. In the present example, the computer 120 is coupled directly to the switch interface 116, but it is understood that the computer 120 may communicate with other components (not shown), which then communicate with the switch interface 116. Furthermore, it is understood that the computer 120 is representative of any control device that may send information to and/or receive information from the switch assembly 102. Accordingly, while the computer 120 is illustrated with a central processing unit (CPU) 124, memory 126, and communication interface 128 (which may be wired and/or wireless) coupled by one or more control lines 130 (e.g., a bus), it is understood that many different control systems may be used with the switch assembly 102 and that various components of the computer 120 may be distributed.

The computer 120 detects input provided via the actuators 112 and detected by the sensors 117. In some embodiments, the computer 120 may also interact with the indicators 114. The computer 120 may be configured to detect the functions provided by the switch assembly 102 and/or may be programmed to assign various functions to particular actuators 112. For example, when the switch assembly 102 is coupled to the switch interface 116, the computer 120 may automatically detect the functions of the various actuators 112 using, for example, a serial number or other code associated with the switch assembly 102. Alternatively or additionally, the computer 120 may be configured to interact with the switch assembly 102 via external instructions entered, for example, by an installer/operator of the switch assembly 102. It is understood that the computer 120 may assign a function to an actuator 112 and/or to a corresponding sensor 117 of the switch interface 116 depending on the particular configuration of the virtual electronic switch system 100.

The computer 120 is further coupled to one or more electrical systems and/or devices 132. The computer 120 associates the function assigned to a particular actuator 112 or sensor 117 with a particular action that may be taken with respect to the electrical systems/devices 132. For example, the computer 120 may assign a hazard light function or a power on/off function to an actuator 112 that is a push button, and may then manipulate the appropriate electrical systems/devices 132 (e.g., lights and ignition components and circuitry) based on actuation of the push button. Similarly, the computer 120 may assign a power seat movement function to an actuator 112 that is a toggle switch, and may then manipulate the appropriate electrical systems/devices 132 (e.g., power seat motors and circuitry) based on actuation of the toggle switch. It is understood that the electrical systems/devices 132 may be any electrical systems/devices present in the vehicle 104, such as a vehicle starter motor, ignition system, head lights, tail lights, power windows, audio system, interior lights such as dome lights, windshield wipers, fan motor(s), and air conditioning and heating systems.

Program logic, such as computer executable instructions, and data may be stored in the memory 126 for execution and use by the CPU 124. The program logic and data may enable the computer 120 to automatically recognize the switch assembly 102 when it is coupled to the switch interface 116, or additional program logic and/or data may be provided to the computer 120 in order for it to recognize the switch assembly 102. Furthermore, the program logic and/or data may enable the computer 120 to assign functions, detect incoming signals from sensors 117 indicating actuation of an actuator 112, and send signals to the electrical systems/devices 132 in response to the incoming signals.

The program logic and data may also enable the computer 120 to change the function associated with a particular actuator 112 and/or sensor 117, allowing various switch assemblies 102 to be used with the switch interface 116 and configured by the computer 120. For example, one of the actuators 112 may have a first function when used with a first switch assembly 102, and another actuator occupying the same position may be assigned another function when used with a second switch assembly. Additionally or alternatively, the function assigned to an actuator 112 of the switch assembly 102 may be changed by the computer 120, thereby providing flexibility without the need to remove the switch assembly 102 and replace it with a different switch assembly. Accordingly, the computer 120 provides a virtual electronic switch system when combined with the switch assembly 102 and switch interface 116, and may configure the functions associated with the switch assembly 102 in many different ways. It is understood that the location of various components, such as the sensors 117, may be moved between the switch assembly 102 and switch interface 116 without changing the underlying operation of the virtual electronic switch system.

Figure 2:
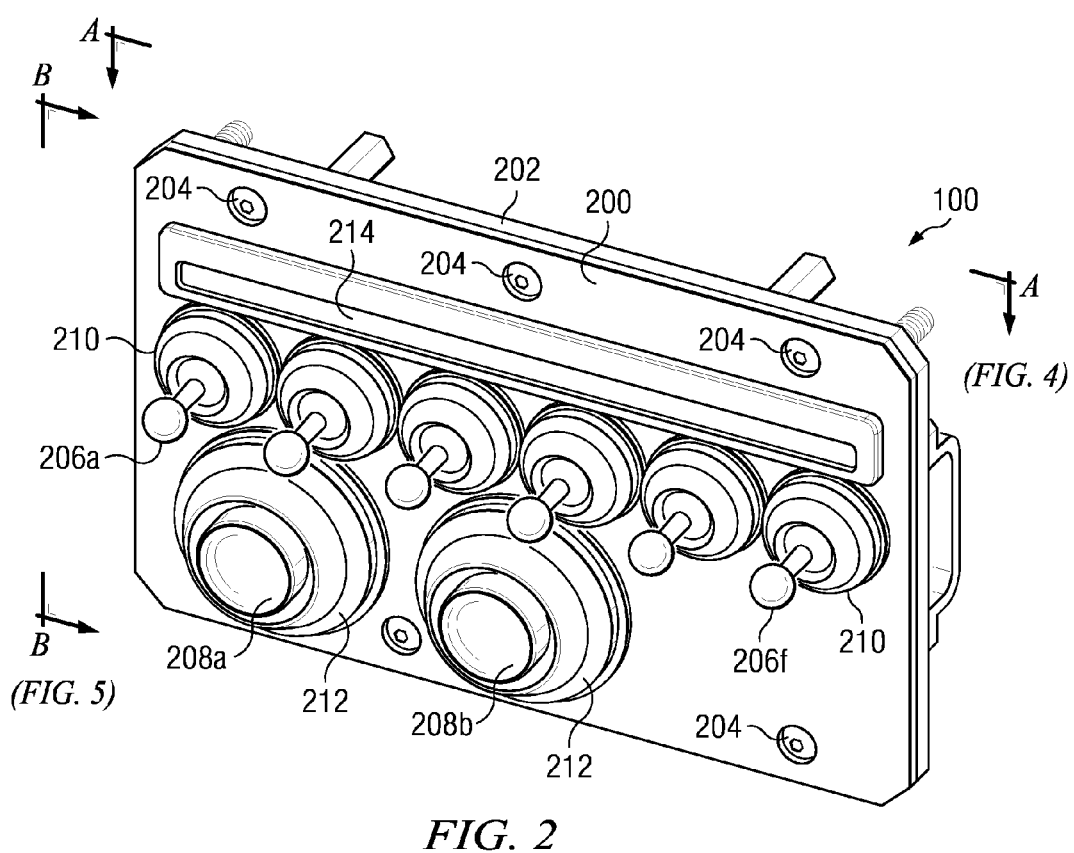
FIG. 2 is a perspective view of one embodiment of a switch assembly that may be used in the virtual electronic switch system of FIG. 1.

Referring to FIG. 2, a perspective view of one embodiment of the switch assembly 102 of FIG. 1 is illustrated. The switch assembly 102 includes a top plate 200 and a bottom plate 202. Fasteners 204, which may be recessed as shown, couple the top plate 200 to the bottom plate 202. The fasteners 204 may be stainless steel self-locking screws or any other type of fasteners capable of coupling the top plate 200 and bottom plate 202.

The top plate 200 is exposed when the switch assembly 102 is mounted in the dash or console of the vehicle 104 and may be formed from any of a variety of suitable materials or a combination of such materials, including a metal such as polished aluminum or stainless steel, or a plastic. For purposes of example, the actuators 112 of FIG. 1 include six switch levers 206a-206f and two push buttons 208a and 208b. Each switch lever 206a-206f may have a corresponding ring 210 and each push button 208a and 208b may have a corresponding ring 212. Various components, such as the push buttons 208a, 208b, and rings 210 and 212 may be formed of any of a variety of materials, such as a synthetic sapphire material.

An information bar 214 may also be present in the cover plate 102. The information bar 214 may include a plurality of the indicators 114 of FIG. 1 and may be configured to provide a visual indication using information supplied by the vehicle 104. The information bar 214 may be made of a material such as synthetic sapphire.

Figure 3:
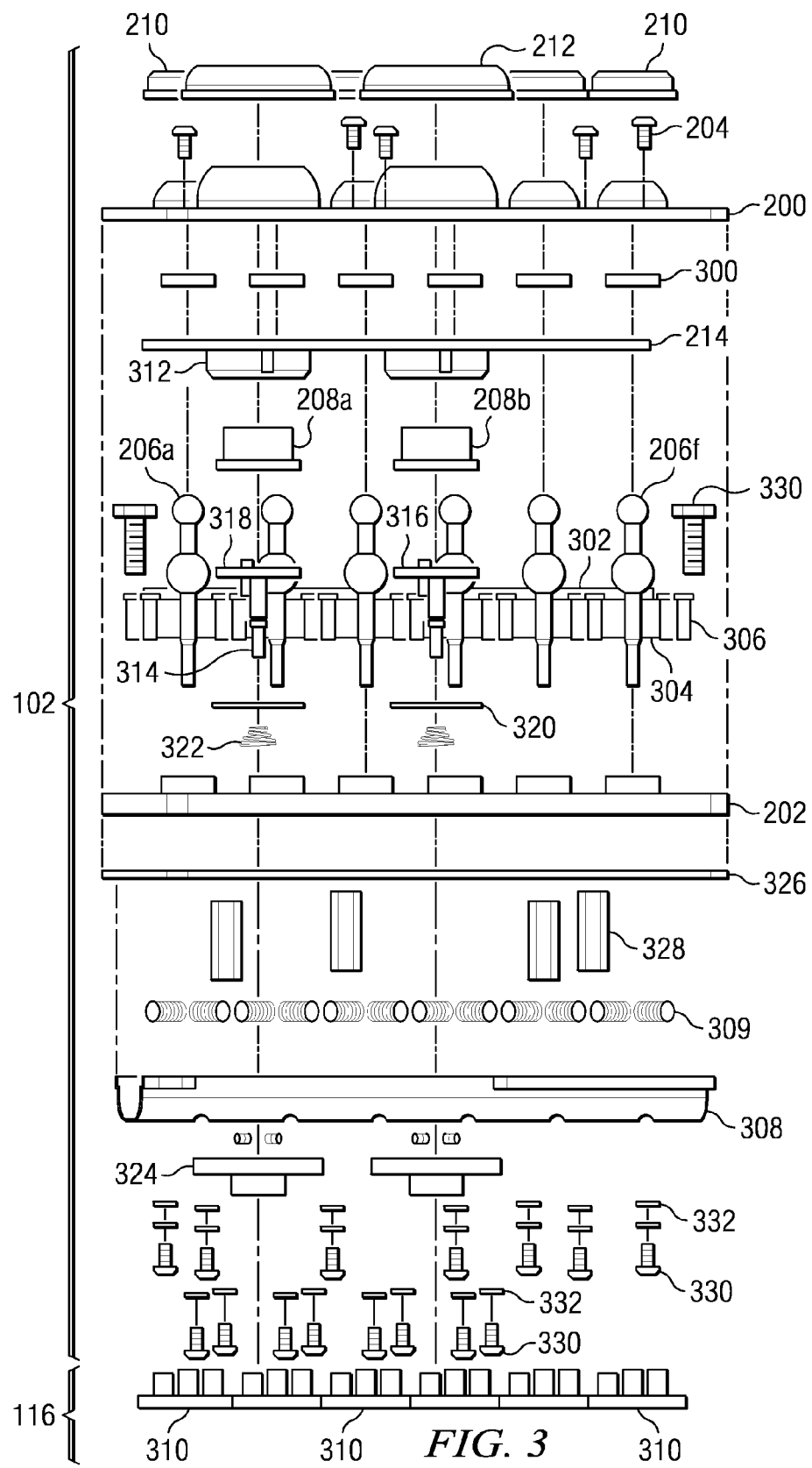
FIG. 3 is an exploded view of the switch assembly of FIG. 2 and a portion of a switch interface.

Referring to FIG. 3, an exploded view of the switch assembly 102 of FIG. 2 is illustrated with a portion of the switch interface 116. The switch assembly 102 includes the rings 210 for the switch levers 206a-206f and the rings 212 for the push buttons 208a and 208b. The top plate 200, which may be molded with features for the switch levers 206a-206f and push buttons 208a and 208b, is shown with fasteners 204. Inserts 300, which may be made of a material such as Teflon, correspond to the switch levers 206a-206f. The information bar 214 is associated with a support plate 302 that underlies the information bar 214.

Each switch lever 206a-206f is associated with a cotter pin or other fastener 304 and multiple spring retainers 306. Springs 309 are used to couple the switch levers 206a-206f to multiple spring retainers 306 and to bias each switch lever 206a-206f in a neutral position. Lower portions of the switch levers 206a-206f pass through the bottom plate 202 and a cover 308. In the present embodiment, the cover 308 may be made of Teflon or a similar material and provides an elongated, substantially flat lower surface having open ends and raised sides parallel with the longitudinal axis of the lower surface. A lower portion of each switch lever 206a-206f serves as an actuator portion that interacts with non-contact sensor units 310 of the switch interface 116 as will be described below in greater detail.

Each push button 208a and 208b is associated with a push button holder 312 into which the push buttons fit. The push buttons 208a and 208b each have an actuator 314, retaining rods 316, and guide shafts 318. A retaining ring 320 holds each push button 208a and 208b in place and springs 322 provide an upward bias to the push buttons. Members 324 serve to secure the push buttons 208a and 208b.

A liner 326 made of a material such as Teflon may be positioned under the bottom plate 202. Stand-offs 328 may be used to maintain a predefined distance between the lower plate 202 and another plate or component, including components of the switch interface 116. Various fasteners 330 and other components, such as washers 332, may be used to couple portions of the switch assembly 102.

Figure 4:
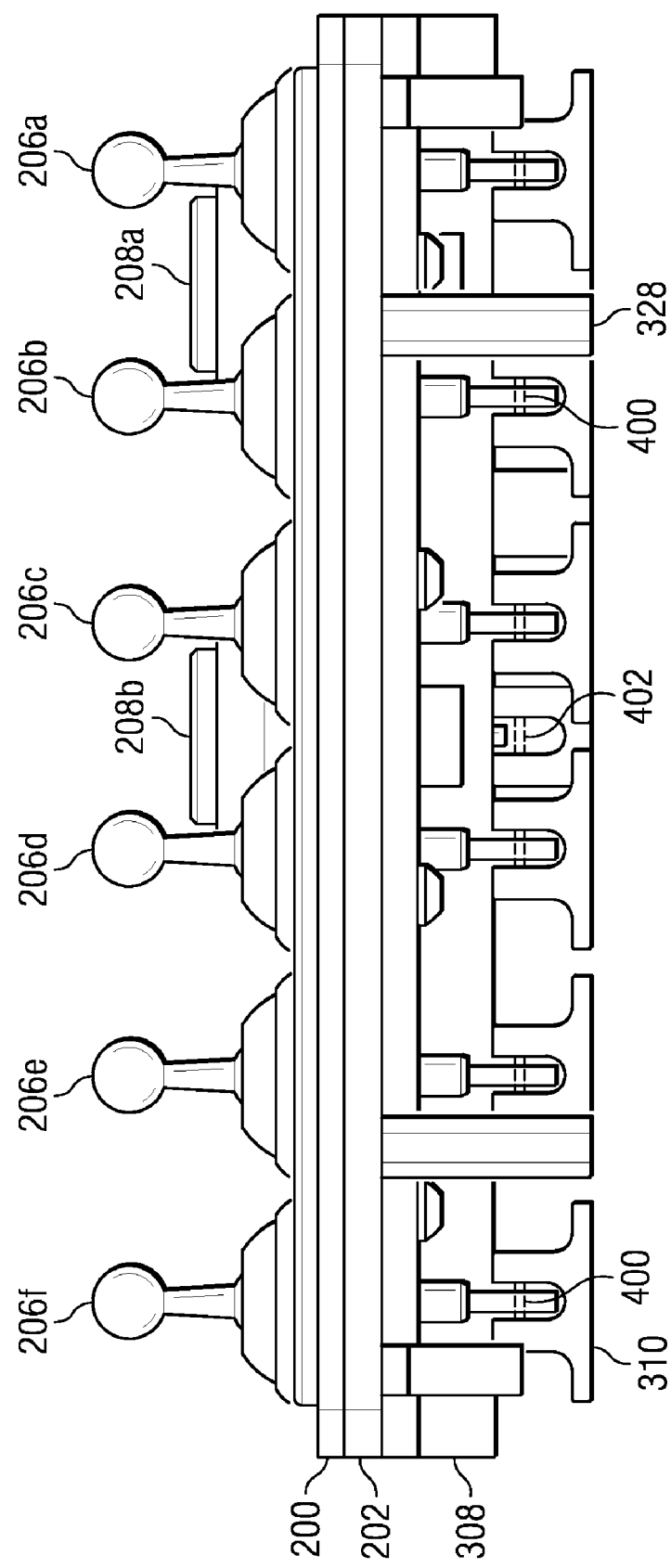
FIG. 4 is a first side view of the switch assembly of FIG. 2 along lines A-A.
Figure 5:
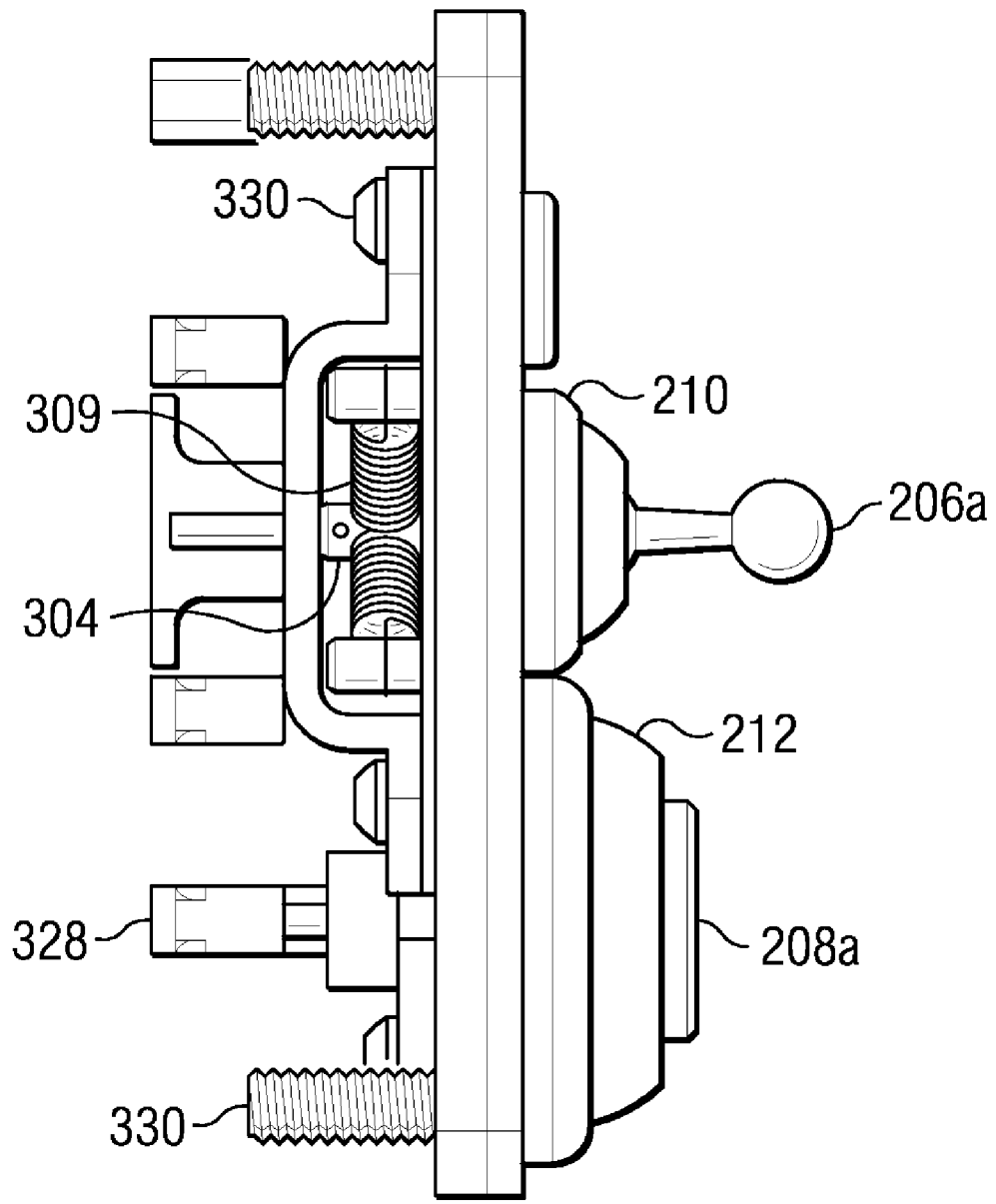
FIG. 5 is a side view of the switch assembly of FIG. 2 along lines B-B.

Referring to FIGS. 4 and 5, a side view along lines A-A of FIG. 2 (FIG. 4) and a side view along lines B-B of FIG. 2 (FIG. 5) are illustrated. As shown in FIG. 4, each of switch actuators portions of the switch levers 206a-206f are positioned to interact with non-contact sensor units 310. Similarly, the actuators 314 of the push buttons 208a and 208b are also positioned to interact with non-contact sensor units 310. In the present example, the non-contact sensor units 310 are optical, but it is understood that many different types of non-contact sensor units may be used. For example, Hall effect sensor units or reed switches may be used in addition to, or as alternatives for, the optical non-contact sensor units 310.

Referring specifically to FIG. 5, the switch lever 206a is illustrated, although the following description may apply equally to the remaining switch levers 206b-206f. The switch lever 206a is associated with four of the spring retainers 306. The spring retainers 306 are positioned on the corners of a square formed around the switch lever 206a, with the longitudinal axis of the switch lever 206a extending through the center of the square. Each of the four spring retainers 306 is coupled to the switch lever 206a by one of the springs 309. The springs 309 exert a relatively even pressure on the switch lever 206a and, as the springs are positioned in opposing pairs that form an X shape, the switch lever 206a is biased in a neutral position in the center of the square. Accordingly, the switch lever 206a may move, but will return to the neutral position when released due to the springs 309.

Figure 6:
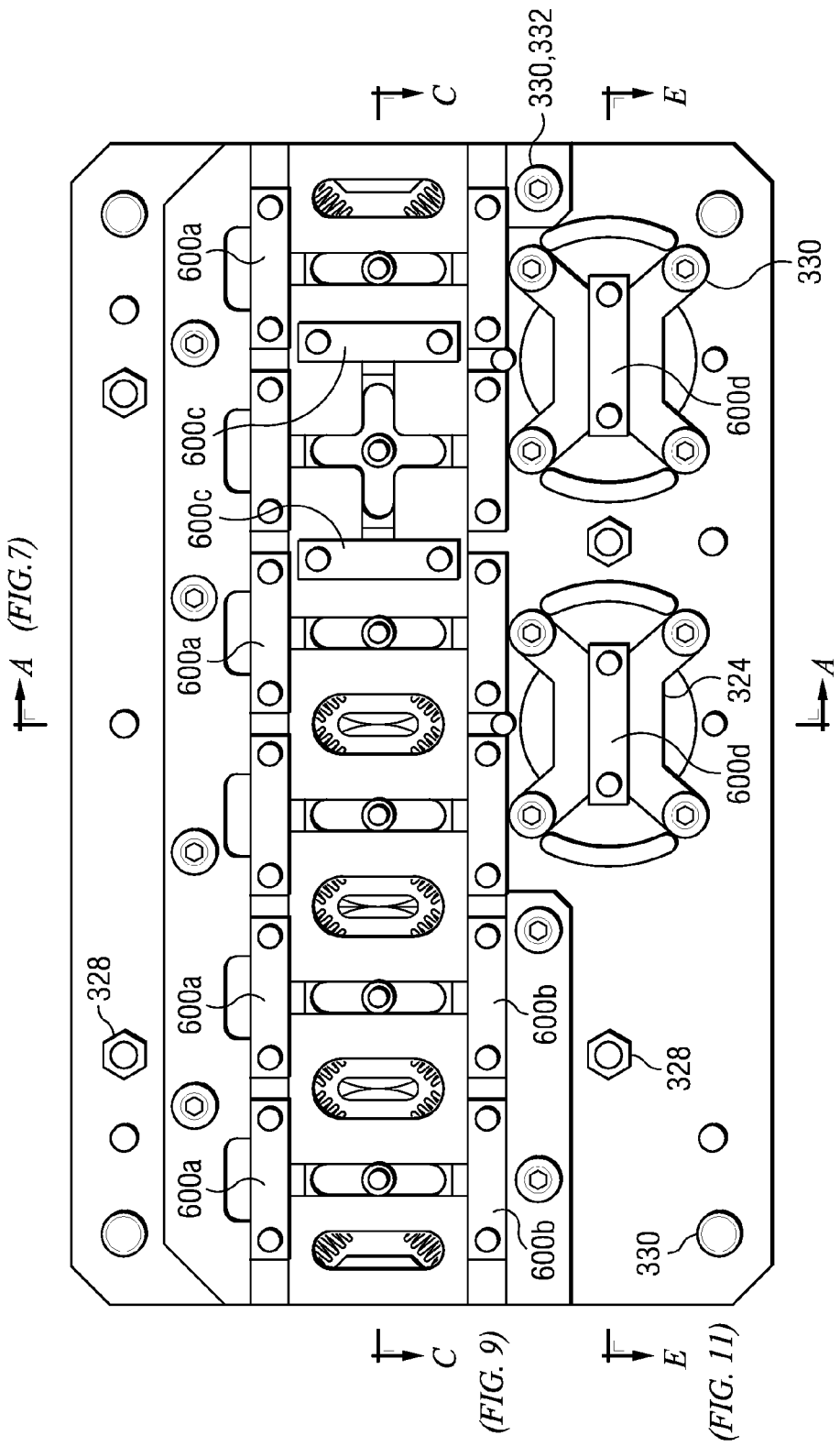
FIG. 6 is a bottom view of the switch assembly of FIG. 2.

Referring to FIG. 6, a bottom view of the switch assembly 102 of FIG. 2 is illustrated. In the present example, the switch levers 206a and 206c-206f are two-way toggle switches that may be toggled either up or down (relative to the orientation of the switch assembly 102 as illustrated in FIG. 1). The switch lever 206b is a four-way toggle switch that can be toggled left and right, as well as up and down. Each push button 208a and 208b is configured to move along a single vertical axis that is perpendicular to the front of the top plate 200.

In the present example, each direction of movement uses an optical sensor pair formed by an optical transmitter and an optical receiver, with the position of each of the optical transmitters and optical receivers being illustrated in FIG. 6 by a small circle. It is understood that a single non-contact sensor unit 310 may be designed to provide one or more of the optical sensor pairs. To detect actuation of a switch lever 206a-206f or a push button 208a or 208b, the corresponding optical sensor pair(s) provide an optical beam that passes from the optical transmitter to the optical receiver. When the beam is broken by the lower actuator portion of a switch lever 206a-206f or the actuator 314 of a push button 208a or 208b, the computer 120 registers this event.

Each optical sensor pair is associated with a particular function by the computer 120. In some embodiments, the computer 120 may register an event when the beam remains broken (e.g., when a switch lever 206a-206f or push button 208a or 208b is held in an actuated position). For example, to move a power seat forward, a switch lever may be held in an up position for continued movement of the power seat until the seat position is satisfactory. In other embodiments, the movement may continue if the switch lever is actuated and released, in which case a second actuation of the switch lever may be used to stop the movement.

As each direction of movement uses an optical sensor pair, the two-way toggle switches provided by the switch levers 206a and 206c-206f each use two optical sensor pairs positioned in first and second rows of optical sensors 600a and 600b, respectively. The four-way toggle switch provided by the switch lever 206b uses four optical sensor pairs, with optical switch pairs 600c oriented perpendicularly to the rows containing the optical sensors 600a and 600b, which are also used by the switch lever 206b. The push buttons 208a and 208b each use a single optical sensor pair 600d positioned in another row. Accordingly, FIG. 6 illustrates a total of sixteen optical sensor pairs. It is understood that the optical transmitter and optical receiver may be on either side depending on the particular configuration of the switch assembly 102.

Referring again to FIG. 4, the locations of the optical beams relative to the lower actuator portions of the switch levers 206a-206b are indicated by lines 400. The location of the optical beam relative to the actuator 314 of the push button 208b is indicated by lines 402.

Figures 7, 8:
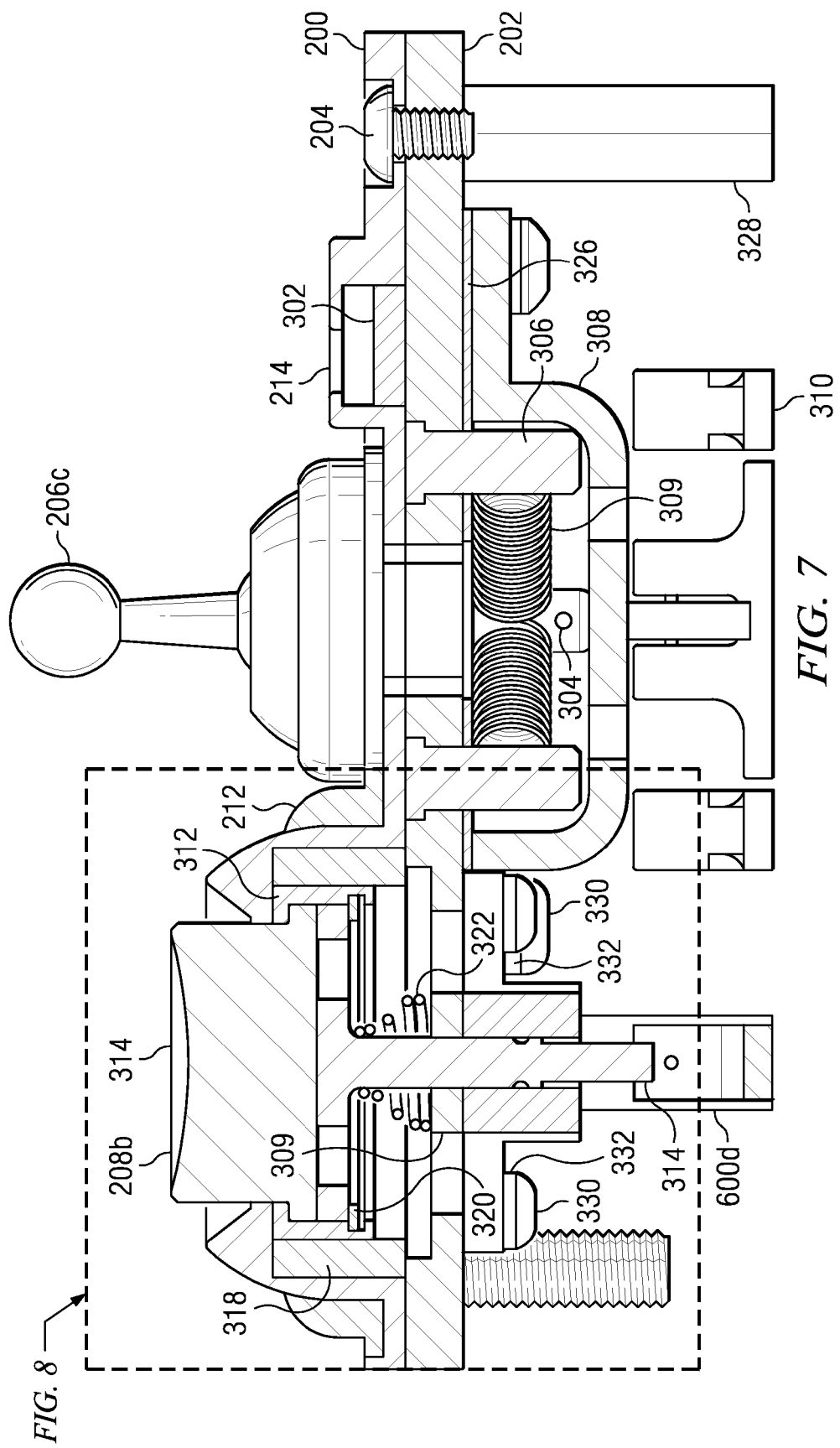
FIG. 7 is a sectional view of the switch assembly of FIG. 6 along lines A-A.
FIG. 8 is an enlarged portion of FIG. 7 as indicated in detail B.
Figure 8:
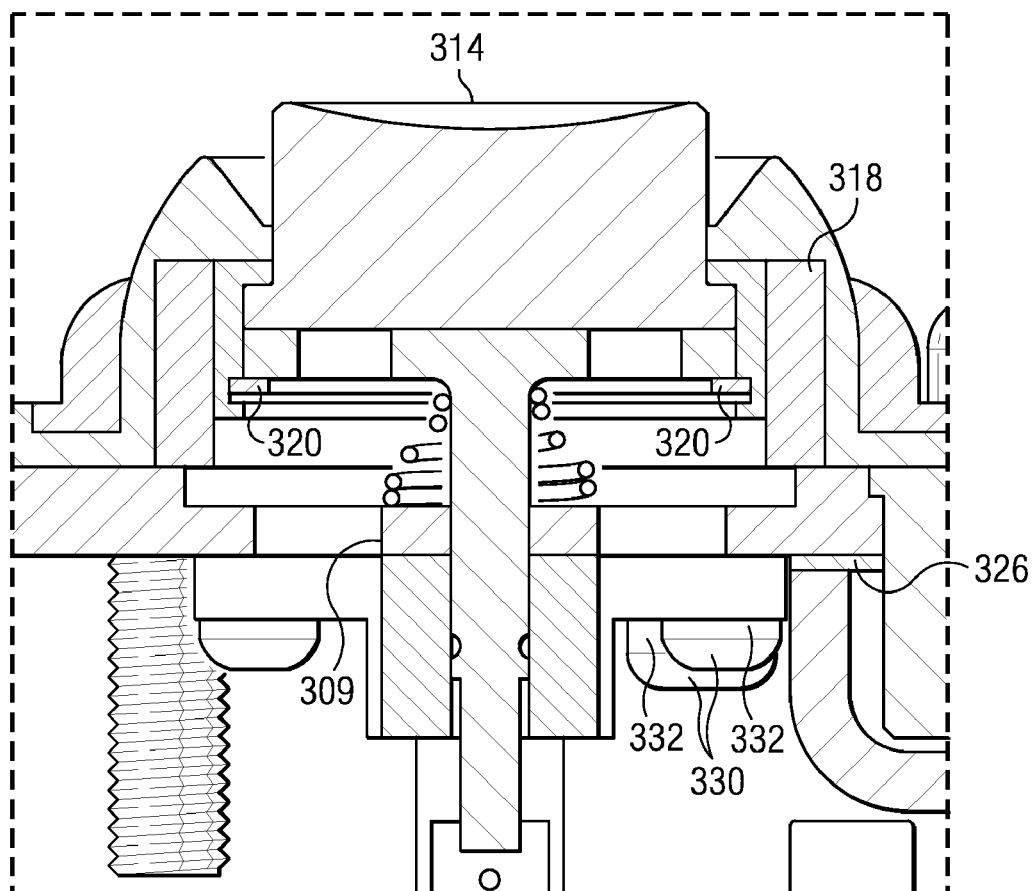

Referring to FIGS. 7 and 8, FIG. 7 illustrates a cross-sectional side view along lines A-A of FIG. 6 showing the push button 208b and switch lever 206c, and FIG. 8 illustrates detail B of FIG. 7. As illustrated, the push button holder 312 retains the push button 208b, which abuts the push button actuator 314. The retaining ring 320 and spring 322 aid in maintaining the position of the push button 208b and provide an upward bias. One side (i.e., either the transmitter or receiver) of the optical pair 600d (FIG. 6) is illustrated below the push button actuator 314, illustrating that the optical beam is not broken unless the push button actuator is depressed. The upward bias provided by the spring 322 maintains the actuator 314 in a neutral state above the optical beam.

The switch lever 206c is illustrated with spring retainers 306, springs 309, and cotter pin 304. The cotter pin 304 may be used to maintain the position of the switch lever 206c, as the cotter pin prevents vertical movement of the switch lever in an upward direction past the point where the springs 309 are attached to the switch lever and in a downward direction past the cover 308.

Figure 9:
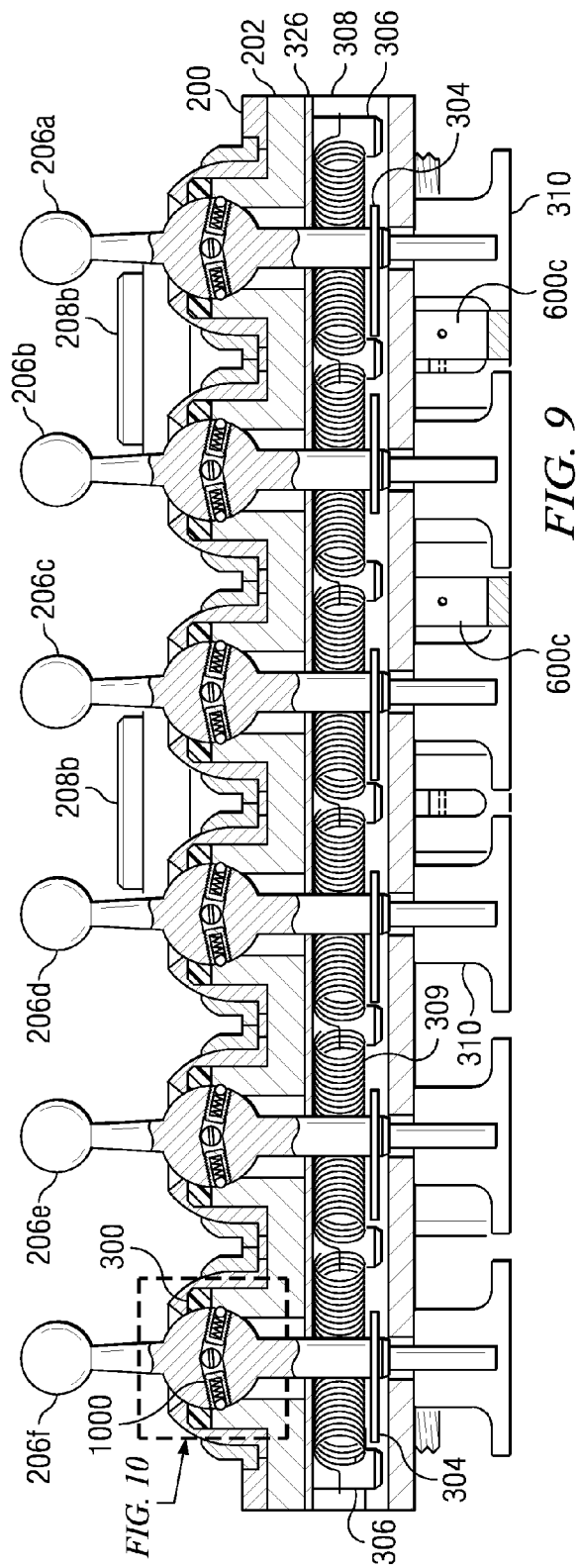
FIG. 9 is a sectional view of the switch assembly of FIG. 6 taken along lines C-C.
Figure 10:
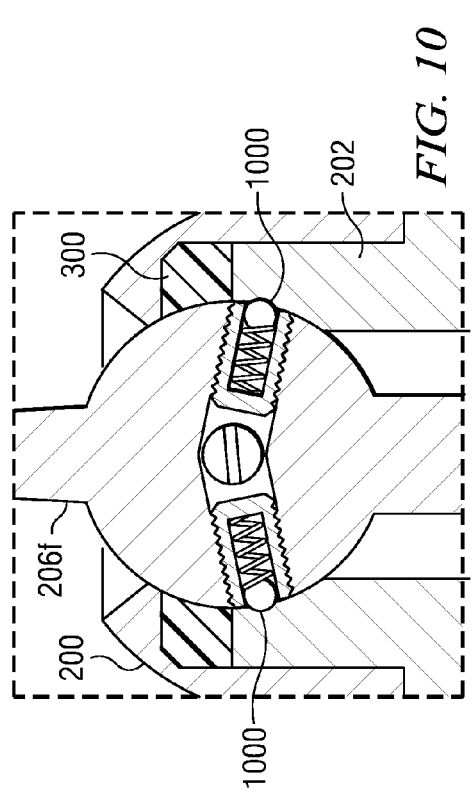
FIG. 10 is an enlarged portion of FIG. 9 as indicated in detail D.

Referring to FIGS. 9 and 10, FIG. 9 illustrates a cross-sectional side view along lines C-C of FIG. 6 showing the switch levers 206a-206f and push buttons 208a and 208b, and FIG. 10 illustrates detail D of FIG. 9. As illustrated, each switch lever 206a-206f is coupled to spring retainers 306 via springs 309 to maintain a neutral position. Optical non-contact sensor units 310 are positioned to receive the lower actuator portions of each of the switch levers 206a-206f. Although optical sensor pairs 600a and 600b are not shown in FIG. 9, one side (i.e., either the transmitter or receiver) of each optical sensor pair 600c is illustrated. As described previously, the optical sensor pairs 600c correspond to the left and right movement of the four-way toggle functionality of the switch lever 206b.

FIG. 10 provides an enlarged view of a portion of the switch lever 206f. The switch lever 206f may include one or more detent mechanisms 1000 to retain the switch lever in a desired position and/or provide a tactile "click" indicating the travel of the switch lever. For example, the detent mechanism 1000 may include a ball-nose spring plunger providing a force in the range of 0.125-0.5 pounds.

Figure 11:
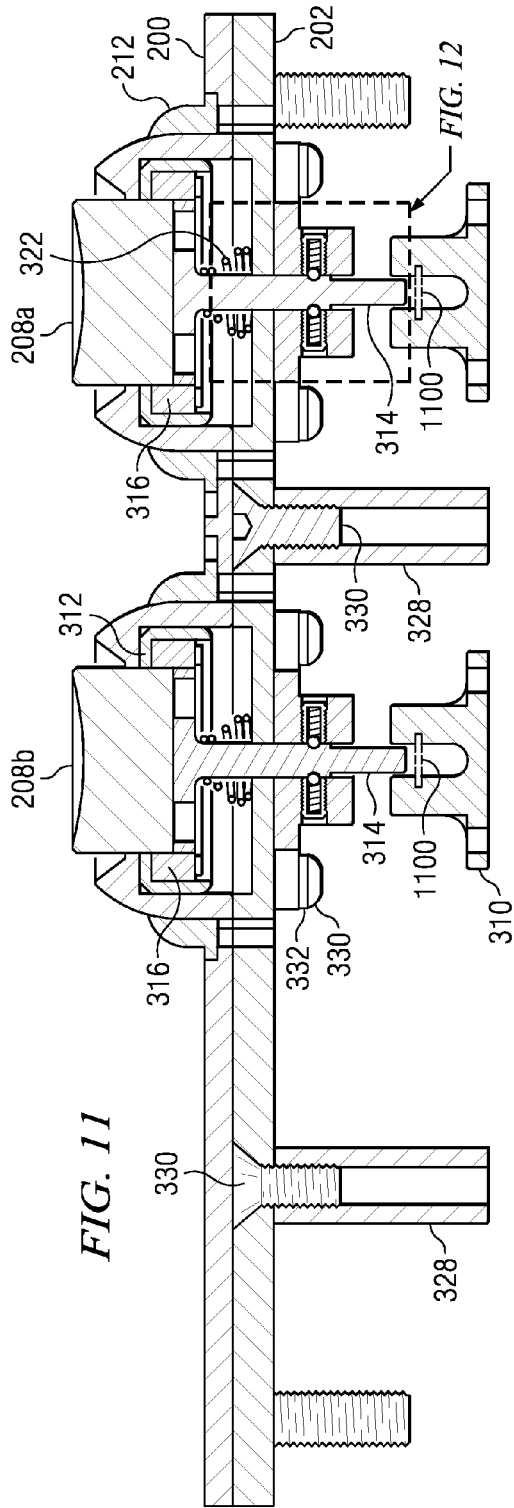
FIG. 11 is a sectional view of the switch assembly of FIG. 6 taken along lines E-E.
Figure 12:
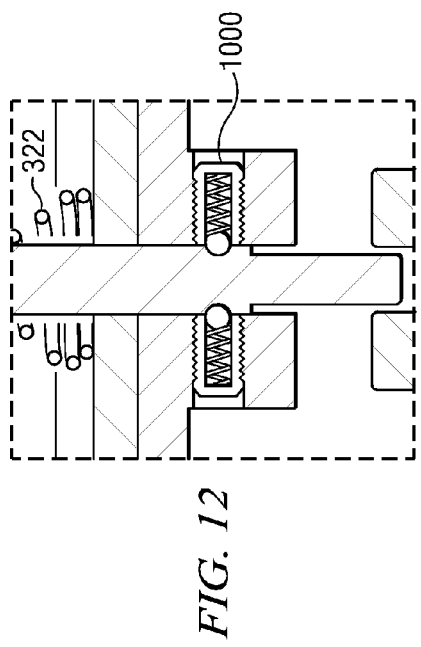
FIG. 12 is an enlarged portion of FIG. 11 as indicated in detail F.

Referring to FIGS. 11 and 12, FIG. 11 illustrates a cross-sectional side view along lines E-E of FIG. 6 showing the push buttons 208a and 208b, and FIG. 12 illustrates detail F of FIG. 11. As illustrated, the push button actuators 314 of the push buttons 208a and 208b are biased in an upwards direction by springs 322. When so biased, the push button actuators 314 are above optical beams 1100 formed by optical pairs 600d. Actuation (e.g., depression) of one of the push buttons 208a or 208b forces the corresponding actuator 314 down and breaks the optical beam 1100, thereby signaling to the computer 120 that the particular push button has been actuated.

FIG. 12 provides an enlarged view of a portion of the push button 208a. The push button 208a may include one or more detent mechanisms 1000 that may be similar or identical to the detent mechanism 1000 of FIG. 10. The detent mechanism 1000 retains the push button 208a in a desired position and/or provides a tactile "click" indicating the travel of the push button actuator 314. For example, the detent mechanism 1100 may include a ball-nose spring plunger providing a force in the range of 0.125-0.5 pounds.

It will be appreciated by those skilled in the art having the benefit of this disclosure that this virtual electronic switch mechanism provides a switch assembly incorporating a front end having a plurality of manually operated switch actuators and an electronic back end that incorporates a plurality of non-contact electronic sensing devices. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A non-contact vehicle switch system comprising:
    a switch assembly having
        a front end including a plate mountable in the vehicle and customizable first and second user accessible features mounted thereon, and
        a back end including first and second actuator members coupled to the first and second user accessible features, respectively, wherein the first and second actuator members provide a switch assembly interface;
    a switch interface coupled to the vehicle and configured to engage the switch assembly interface, the switch interface including first and second non-contact sensor units configured to detect a pre-defined movement pattern of the first and second actuator members, respectively; and
    a computer coupled to the switch interface, wherein the computer is configured receive information from the first and second non-contact sensor units, and to manipulate at least one function of an electrical system using the received information, wherein the manipulated function is selected from a plurality of available functions and assigned to one of the first and second sensor units based on instructions provided to the computer.

2. The non-contact vehicle switch system of claim 1 wherein the first and second non-contact sensor units are optical.

3. The non-contact vehicle switch system of claim 2 wherein the first non-contact sensor unit has a single optical transmitter positioned opposite a single optical receiver to create an optical beam that is broken when the first actuator member passes between the optical transmitter and optical receiver.

4. The non-contact vehicle switch system of claim 3 wherein the second non-contact sensor unit includes a first optical transmitter positioned opposite a first optical receiver to create a first optical beam and a second optical transmitter positioned opposite a second optical receiver to create a second optical beam, wherein the first and second optical beams are substantially parallel, and wherein the second actuator member is positioned between the first and second optical beams when in a non-actuated state.

5. The non-contact vehicle switch system of claim 4 wherein the first actuator member is a push button and the second actuator member is a switch lever.

6. The non-contact vehicle switch system of claim 4 wherein the second actuator member is biased into the non-actuated state by a plurality of springs.

7. The non-contact vehicle switch system of claim 6 wherein the second actuator member is centered between first, second, third, and fourth retaining posts, and wherein first, second, third and fourth springs, respectively, connect the first, second, third, and fourth retaining posts to the second actuator member, and wherein each of the first, second, third and fourth springs is configured to resist movement of the second actuator member in a direction away from the respective first, second, third and fourth retaining posts.

8. The non-contact vehicle switch system of claim 4 wherein the second non-contact sensor unit includes a third optical transmitter positioned opposite a third optical receiver to create a third optical beam and a fourth optical transmitter positioned opposite a fourth optical receiver to create a fourth optical beam, wherein the third and fourth optical beams are substantially parallel to one another and perpendicular to the first and second optical beams, and wherein the second actuator member is positioned between the third and fourth optical beams when in a non-actuated state.

9. The non-contact vehicle switch system of claim 4 wherein the computer is configured to register the first actuator member passing between the optical transmitter and optical receiver of the first non-contact sensing unit as a single actuation of the first user accessible feature.

10. The non-contact vehicle switch system of claim 4 wherein the computer is configured to register the second actuator member passing between the first optical transmitter and first optical receiver as a first actuation of the second user accessible feature, and wherein the computer is configured to register the second actuator member passing between the second optical transmitter and second optical receiver as a second actuation of the second user accessible feature, wherein the first and second actuations correspond to first and second functions, respectively, of the at least one electrical system.

11. The non-contact vehicle switch system of claim 10 wherein the computer is configured to manipulate the first function as long as the first actuator member is positioned between the between the first optical transmitter and first optical receiver.

12. The non-contact vehicle switch system of claim 1 wherein the computer automatically detects a function associated with each of the first and second actuator members when the switch assembly is coupled to the switch interface.

13. A virtual electronic switch system comprising:
a first switch assembly having a plurality of first actuators coupled to a first support structure, wherein each of the plurality of first actuators includes a first user manipulatable portion accessible from a first external faceplate and a first actuator portion that extends through the first external faceplate;
a switch interface having a plurality of non-contact sensors configured to mate with the first actuator portions of the plurality of first actuators, wherein each of the plurality of non-contact sensors is configured to detect movement within a defined movement range for each of the corresponding first actuator portions; and
a computer coupled to the switch interface and configured to receive information about the first switch assembly, wherein the information includes a position and a function assigned to each of the plurality of first actuators and associated non-contact sensors, wherein the function assigned to a particular one of the plurality of first actuators and non-contact switches is selected from a plurality of available functions, and wherein the computer is configured to receive a signal from one of the plurality of non-contact sensors indicating a detected movement of the corresponding first actuator portion and to execute the function included in the information in response to the received signal.

14. The virtual electronic switch system of claim 13 wherein receiving information about the first switch assembly includes retrieving the information from a memory based on identification information provided to the computer.

15. The virtual electronic switch system of claim 13 further comprising a second switch assembly having a plurality of second actuators coupled to a second support structure, wherein each of the plurality of second actuators includes a second user manipulatable portion accessible from a second external faceplate and a second actuator portion that extends through the second external faceplate, wherein the second user manipulatable portions differ from the first user manipulatable portions and wherein the second actuator portions are identical to the first actuator portions.

16. The virtual electronic switch system of claim 15 wherein the computer is configured to receive information about the second switch assembly, wherein the information includes a position and a function assigned to each of the plurality of second actuators, and wherein the function of each of the plurality of second actuators differs from the function of each of the plurality of first actuators for first and second actuators having the same position.

17. The virtual electronic switch system of claim 13 wherein the computer is configured to assign a different function than that identified in the information to at least one of the plurality of first actuators and associated non-contact sensors.

18. The virtual electronic switch system of claim 17 wherein the different function is not present in the received information.

19. The virtual electronic switch system of claim 17 wherein the different function is present in the received information but assigned to another one of the plurality of first actuators and associated non-contact sensors.

* * * * *